(12) United States Patent
Ijichi et al.

(10) Patent No.: US 6,542,445 B2
(45) Date of Patent: Apr. 1, 2003

(54) METHOD FOR EDITING A PLAYLIST TO READ MAIN DATA IN A DESIRED REPRODUCTION SEQUENCE

(75) Inventors: Susumu Ijichi, Kanagawa (JP); Teruyuki Shitara, Tokyo (JP); Mari Sugiura, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/090,253

(22) Filed: Mar. 4, 2002

(65) Prior Publication Data

US 2002/0093886 A1 Jul. 18, 2002

Related U.S. Application Data

(62) Division of application No. 09/517,477, filed on Mar. 2, 2000, now abandoned.

(30) Foreign Application Priority Data

Mar. 2, 1999 (JP) .......................................... 11-053951

(51) Int. Cl.[7] .............................................. G11B 21/08
(52) U.S. Cl. ............................... 369/30.08; 369/30.05; 369/30.19
(58) Field of Search ........................... 369/30.08, 30.05, 369/30.19, 30.09, 30.27, 33.01, 83, 84, 275.3; 360/13, 15; 386/52, 55

(56) References Cited

U.S. PATENT DOCUMENTS

| | | | | |
|---|---|---|---|---|
| 5,168,481 A | * | 12/1992 | Culbertson et al. | 369/2 |
| 5,687,160 A | * | 11/1997 | Aotake et al. | 369/275.3 |
| 5,793,726 A | * | 8/1998 | Nagano | 369/47 |
| 5,841,740 A | * | 11/1998 | Fijita et al. | 369/32 |
| 5,907,658 A | * | 5/1999 | Murase et al. | 386/95 |
| 5,970,028 A | * | 10/1999 | Shimabukuro | 369/32 |
| 6,031,797 A | * | 2/2000 | Van Ryzin et al. | 369/33 |
| 6,128,255 A | * | 10/2000 | Yankowski | 369/30 |
| 6,163,510 A | * | 12/2000 | Lee et al. | 369/32 |
| 6,185,163 B1 | * | 2/2001 | Bickford et al. | 369/32 |
| 6,285,826 B1 | * | 9/2001 | Murase et al. | 386/125 |
| 6,421,499 B1 | * | 7/2002 | Kim et al. | 386/95 |
| 2002/0094193 A1 | * | 7/2002 | Tao et al. | 386/52 |

* cited by examiner

Primary Examiner—Tan Dinh
(74) Attorney, Agent, or Firm—Jay H. Maioli

(57) ABSTRACT

A method and apparatus for reproducing a plurality of main data recorded on an insertable recording medium in the desired sequence specified as a playlist by the user. Main data is recorded on a record region of the recording medium and the user can select a playlist that is recorded in a management region of the recording medium.

8 Claims, 12 Drawing Sheets

METHOD FOR EDITING A PLAYLIST TO READ MAIN DATA IN A DESIRED REPRODUCTION SEQUENCE

This is a division of prior application Ser. No. 09/517,477 on Mar. 2, 2000. now abandoned

FIELD OF THE INVENTION

The present invention relates to a reproduction method and a device to carry out reproduction based on a reproduction list for reproducing a plurality of main data recorded on an insertable recording medium in the desired sequence specified by the user, and also for user to select a reproduction list for use from a plurality of reproduction lists based on the reproduction list table for managing the plurality of reproduction lists, and further relates to an editing method and an editing device to generate the reproduction list and the reproduction list table.

BACKGROUND OF THE INVENTION

In recent years compact recording mediums are being developed, incorporating fixed memory elements such as flash memories, and mounted into dedicated drives, or drive devices in audio/video equipment, information equipment, for the storage of computer data, still image data, moving image data, music data, and audio data, etc.

On the other hand, media has spread in the conventional art such as compact disks (CD) and minidisks (MD) {trademark} for storing music data that make recording and reproduction possible by using CD player and MD recorder/players.

However, in systems that for instance utilize compact discs (CD) and minidiscs (MD) [trademark], the music data for one song is recorded as one track. Management information referred to as TOC (Table of Contents) is also recorded on that media so that each track is managed so as to be sequentially reproduced in a specified order.

A track number is typically assigned to each track and the TOC manages the address of the recording position at each track number. In the reproduction device (player), each track number is reproduced in the track number sequence by referring to the TOC.

The user however may enjoy reproduction of the music or other information not only by reproduction of all tracks in the track number sequence but also by tracks preferred by the user, for instance by reproduction of all or a portion of the tracks in a preferred sequence. In order to meet demands for reproduction of tracks in a user-preferred sequence, in the related art, functions referred to as Program Playback and Track Move were added to CD players and MD players.

In the Program Playback function, the user specifies a desired sequence of songs recorded on the tracks on for instance the CD or MD recording medium loaded in the reproduction device, and reproduction is performed in the song sequence as specified by the user.

In the Track Move Function implemented in an MD system, the track numbers themselves are changed or in other words, interchanged in the TOC recorded in the MD. When, for instance, five tracks are recorded on the tracks from track #1 through track #5, and the user wants to hear the fifth song of track #5 as the first song, then that fifth song is changed to track #1 or in other words changed to become the first song, by rewriting the TOC data. The user can then enjoy reproduction of the music in the desired song sequence even during reproduction in the track number sequence, by interchanging the track number itself.

However, in the system of the related art, setting a desired song sequence is not easy on the respective recording mediums and also during reproduction.

When using the Program Playback function for instance, the song sequence specified by the user is stored in the memory within that reproduction device (player) and reproduction is performed based on that stored song sequence. However, after Program Playback, the stored content, in other words, the stored song sequence is not retained after the power is turned off or after the disk is ejected. If the disk is replaced with another disk, the song sequence that was specified prior to insertion of the new disk is of course, not usable.

Accordingly, when using the Program Playback function, the user must perform the operation to specify the desired song sequence each time reproduction is to be performed.

Restated, Program Playback is not a satisfactory function when the user want to reproduce even for just one time, a song sequence that is different from the usual song sequence.

When using the Track Move function on the other hand, once Track Move is performed, that status, or in other words, the status where the track numbers are changed is retained in the TOC so that the now altered song sequence will afterwards always be reproduced in that same sequence. This situation is fine when the user wants to reproduce all future songs in this new song sequence but the Track Move function is not satisfactory when the user wants to reproduce a different song sequence even just one time.

Therefore, even though the Program Playback and Track Move functions each have their respective advantages, these functions cannot set many, diverse song sequences on respective recording medium each recorded with different songs, etc. Further, these functions do not allow the desired song sequence to easily be selected each time reproduction is performed.

SUMMARY OF THE INVENTION

In view of the above problems with the related art, the present invention has the object of providing a reproduction method to reproduce the main reproduction data in a desired reproduction sequence from a recording medium having a record region recorded with a plurality of main data, a first management region to manage the recording position of the main data, and a second management region recorded with a playlist to manage the reproduction sequence of the main data, wherein the reproduction method comprises a step to retrieve whether a playlist for reproduction of the main data in the desired sequence is recorded or not on the second management region on the recording medium; and a step to readout and reproduce the main data from the record area based on the first management region, in the reproduction sequence according to the retrieved playlist when as a result of the above retrieving.step, the playlist is retrieved in the second management region.

The present invention has the further object of providing an editing method to edit a playlist for reproducing the main data in the desired reproduction sequence from a recording medium having a record region recorded with a plurality of main data, a first management region to manage the recording position of the main data, and a second management region for managing the reproduction sequence of the main data, wherein the editing method comprises a step to display information relating to the main data recorded on the management region based on the first management region; a step to sequentially select the main data registered on said playlist from the displayed information according to the user operation; and a step to register the selected main data, the information related to the first management region, and the reproduction sequence of the main data, in the related playlist of the second management region.

The present invention has the still further object of providing a reproduction device for reproduction of main data in a desired sequence from a recording medium having a record region recorded with a plurality of main data, a first management region to manage the recording position of the main data, and a second management region for managing the reproduction sequence of the main data, wherein the reproduction device comprises a reproduction means for reproducing the main data from the record region; retrieving means for retrieve whether or not a playlist is recorded on the second management region for reproduction of the main data in the desired sequence; first acquisition means for acquiring a playlist from the second management region; second acquisition means for acquiring the record position of the main data from the first management region; and control means for acquiring the playlist retrieved by the first acquisition means when the playlist was retrieved in the second management region by retrieving in the above retrieving means, acquiring the record position of the main data reproduced in sequence by the second acquisition means based on the playlist, and reproduce, the main data with the reproduction means based on the acquired main data recording position.

The present invention has the yet further object of providing an editing device to edit the playlist for reproduction of data in a desired reproduction sequence from a recording medium having a record region recorded with a plurality of main data, a first management region to manage the recording position of the main data, and a second management region for managing the reproduction sequence of the main data, wherein the editing device comprises display means for displaying information related to the main data recorded in the record region based on the first management region; operating means for the user to select the main data registered in the prelist from among the displayed information; write means for writing the edited playlist onto the recording medium; and control means for displaying with the display means, information related to the main data recorded on the record region based on said first management region, obtaining by the operating means the instructions selected for the main data selected by the user from information relating to data displayed with the display means, sequentially recording on the related playlist the data selected by the user with information relating to the first management region and the reproduction sequence of the main data, and recording the playlist in the second management region of the recording medium by use of said write means.

DESCRIPTION OF THE PREFERRED EMBODIMENTS

The embodiments of the present invention are next explained while referring to the accompanying drawings. In this embodiment, a stick memory having a stick-shaped contour is described as the recording medium, and drive device to perform record and reproduction of the stick memory is described.

The description will be given in the following order.

Figure 1:
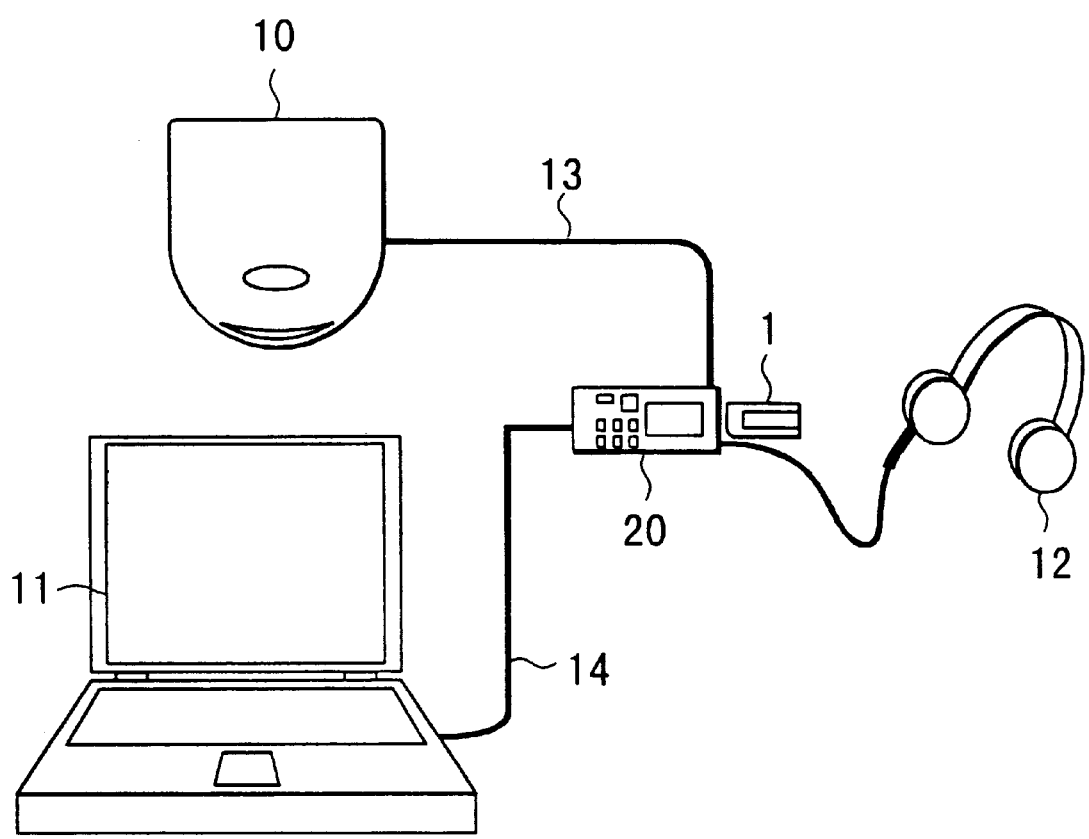
FIG. 1 is a concept view showing a typical connection including the drive device for the embodiment of the present invention.

1. System connections
2. Stick memory
3. Drive device structure
4. File configuration inside stick memory
5. Playlist creation process
6. Reproduction process
7. Copy process 1. System Connections A typical system connection for a drive device 20 is shown in FIG. 1. Data recording and reproducing of data for that stick memory 1 can be performed by loading a stick memory 1 in the drive device 20. If a stick memory I recorded for instance with music data is loaded into the drive device 20, then the music can be heard by connecting the headphones 12 and playing back the music.

The reproduction audio signal can be input from a CD player 10 and recorded on the stick memory 1 by connecting a cable 13 to the CD player 10 utilized as the external reproduction device.

Data supplied from a personal computer 11 can be recorded on the stick memory 1 or data reproduced from the stick memory 1 can be transferred to the personal computer 11 by connecting a USB (Universal Serial Bus) cable 15 to an information device such as a personal computer 11.

Also, though not shown in the figure, a microphone can be connected and the resultant collected audio recorded on the stick memory 1; or a recording device such as an MD recorded can be connected and data supplied, and the data recorded on the recording medium loaded in that recording device.

By connecting various devices in this way to the drive device 20, recording or reproduction can be performed even in a portable state or connections can be made to devices installed for instance in the garden or the workplace and system then operated.

The drive device 20 in this example for instance has a display which allows data such as document data and image data recorded in the stick memory 1 to be reproduced in the drive device 20 unit.

Also, though not installed in the structure of the drive device 20 of the subsequently related example, if an internal microphone or speaker is provided, then reproduction of music, audio or moving images or recording can be performed from the stick memory 1 in the drive device 20 unit.

2. Stick memory

The external contours of the stick memory 1 utilized as the recording medium in this example are described while referring to FIG. 2A, FIG. 2B, FIG. 2C and FIG. 2D.

The stick memory 1 is for instance having a memory element with specified capacity in the stick shapes inside the chassis of FIG. 2A, FIG. 2B, FIG. 2C and FIG. 2D. In these examples, a flash memory is utilized as the memory element.

Figure 2A:
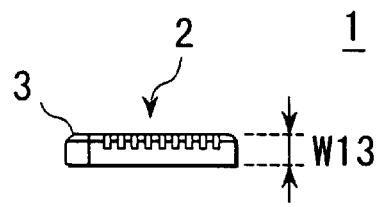
FIG. 2A is an elevational view of the outer contours of the stick memory of the embodiment.
Figure 2B:
FIG. 2B is a side view showing the outer contours of the stick memory of the embodiment.
Figure 2C:
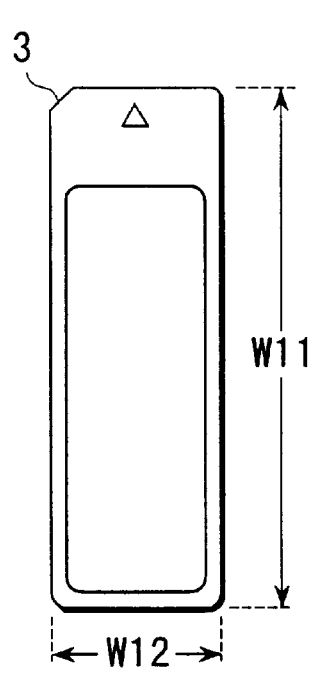
FIG. 2C is a flat view showing the outer contours of the stick memory of the embodiment.
Figure 2D:
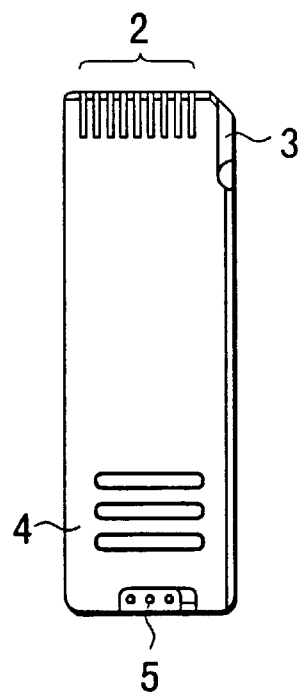
FIG. 2D is a bottom view showing the outer contours of the stick memory of the embodiment.

The chassis shown in the flat view of FIG. 2C, the elevated view of FIG. 2A, the side view of FIG. 2B and the bottom view of FIG. 2D are formed for instance by a plastic mold. A working example of sizes for the widths W11, W12, W13 shown in the figure is W11=60 mm, W12=20 mm, W13=2.8 mm.

The terminal section 2 is formed to have nine electrodes from the bottom of the elevated portion to the bottom side. Read-out and write operations are performed on the internal portion of the memory element from this terminal 2.

A notch 3 is formed on the upper left towards the flat side of the chassis. The notch 3 prevents the stick memory 1 from being inserted facing in the wrong direction when being loaded into the loading mechanism in the drive device.

An irregular section 4 was formed on the bottom side of the chassis with the purpose of preventing slipping to improve operability.

The bottom side is formed with a slide switch 5 with the object of preventing mistaken erasure of the memory contents.

In a stick memory 1, the capacity of the flash memory is specified as any of 4 MB (megabytes), 8 MB, 16 MB, 32 MB, 64 MB and 128 MB.

A so-called FAT (File Allocation Table) system is utilized as a file system for data recording or reproduction.

3. Drive device structure

The structure of the drive device 20 is explained using the examples of FIG. 3A, FIG. 3B, FIG. 3C, FIG. 3D and FIG. 4.

An example of the outer contours of the drive device 20 is shown with the flat view, upper view, left side view and bottom view of FIG. 3A, FIG. 3B, FIG. 3C, FIG. 3D.

Figure 3A:
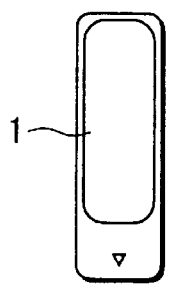
FIG. 3A is a flat view showing the outer contours of the drive device of the embodiment.
Figure 3B:
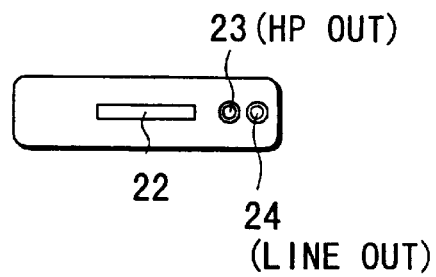
FIG. 3B is a top view showing the outer contours of the drive device of the embodiment.

The stick memory 1 is inserted in the loader 22 formed in the top side of the device as shown in FIG. 3B.

A display section 21 is formed for instance of a liquid crystal panel in the drive device 20 and the reproduced images and characters, or the information appended to the reproduced audio or music and also a guide message for operation are displayed.

Different types of terminals (or jacks) are formed for connecting to each type of equipment as shown in FIG. 1. A headphone terminal 23 and a line output terminal (jack) 24 are formed for instance on the upper side as shown in FIG. 3B. By connecting a headphone 12 to the headphone terminal 23 as shown in FIG. 1, an audio reproduction signal is supplied to the headphone 12 and the user can hear the reproduced audio.

The line output terminal (jack) 24 can be connected by an audio cable to an external device, to supply a reproduction audio signal to that external device. By connecting a speaker system for instance to an audio amplifier, reproduced music or audio from the stick memory 1 can be heard, or by connecting a mini-disk recorder or tape recorder, reproduced music or audio from the stick memory 1 can also be recorded (dubbed) onto another medium.

Figure 3C:
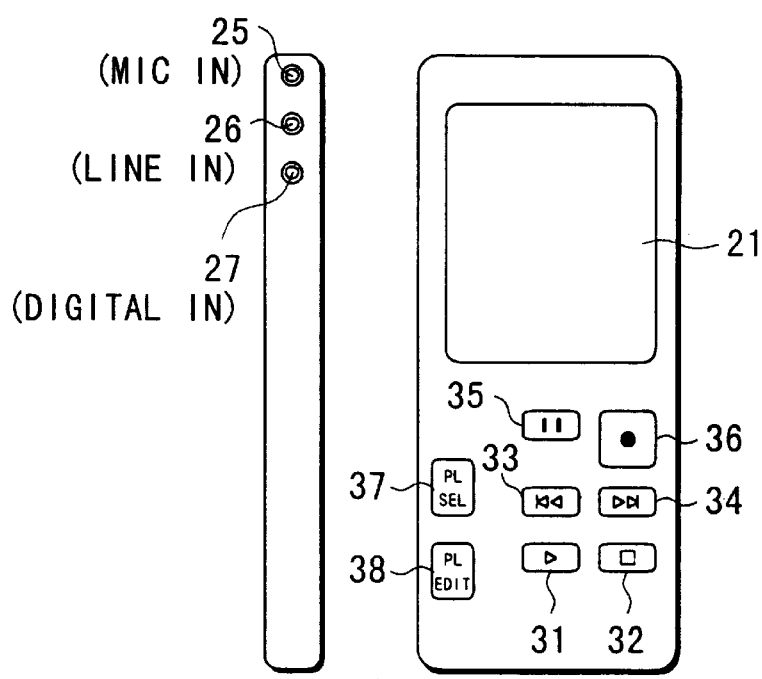
FIG. 3C is a left side view showing the outer contours of the drive device of the embodiment.

A microphone input terminal (jack) (25), line input terminal 26 and a digital input terminal 27 are for instance formed on the side of the drive device 20 as shown in FIG. 3C.

By connecting a microphone to the microphone input terminal (jack) (25), the audio signal from the microphone can be input to the drive device 20 and can be recorded for instance on the stick memory 1.

Also, by connecting an external device such as the CD player 10 as shown in FIG. 1 to the line input terminal 26, an audio signal can be supplied from the external device and can be recorded for instance on the stick memory 1.

Further, digital audio data transmitted by optical cable can be input by means of the digital input terminal 27. If for instance, an external CD player is compatible with digital signal outputs, then digital dubbing can be performed by connecting an optical cable.

Figure 3D:
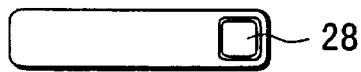
FIG. 3D is a bottom view showing the outer contours of the drive device of the embodiment.

A USB connector 28 is formed on the bottom side of the drive device 20 as shown in FIG. 3D. The USB connector 28 allows various types of communication and data exchange with USB compatible equipment such as a personal computer having a USB interface.

The above described types and quantities of terminals (or jacks) are only examples, and others types configurations and quantities are also allowed. A digital output terminal (jack) may be installed that is compatible with optical cables, or a SCSI (Small Computer System Interface) connector, RS232C connector, or an IEEE 1394 connector may be formed, etc.

The structure of these terminals (jacks) is known in the related art and is thus not described here, however the headphone terminal 23 and the line input terminal 24 may be combined for joint use as one terminal, or may be further combined with the digital output terminal 27 for joint use.

Similarly, the microphone input 25, the digital input terminal 27 and the line input terminal 26 may also be combined for joint use as one terminal.

The drive device 20 is further installed with operating keys for utilization by the user, such as a play key 31, a stop key 32, a REW and AMS (Automatic Music Search) key 33, FF (fast-forward) and AMS key 34, a pause key 35, and a record key 36.

These operating keys are applicable in particular to the recording and reproduction of audio or music data or moving picture data however the above description constitutes nothing more than an example. Keys other than those related above, such as cursor movement keys, number keys, or operating dials such as jog dials may also be installed.

Also in this example, a playlist select key 37 and a playlist edit key 38 are installed in order to operate the subsequently related playlist. The processing corresponding to these operations is related later on.

A power on/off key is not shown however the power on/off key may be combined for joint used with for instance, the play key 31, or the circuitry may be designed to turn off the power after a specified time has elapsed after pressing the stop key 32, so that the power key is not required. A power supply key may of course be installed.

A variety of types and quantities of operating keys may be installed however the operations for the recording and reproduction including the writing and selection of the subsequently related playlist, as well as the operation for copying of the playlist are possible with just the operating keys shown in FIG. 3A, and reducing the quantity of keys, as well as making their equipment more compact and inexpensive may also be implemented.

The internal structure of the drive device 20 is shown in FIG. 4A. The drive device 20 can handle many different types of main data including moving image data, still image data, voice data, music data input from compact disks (CD) and ROMs, and control data, for read out and write on the stick memory 1.

A CPU 41 is the central processing unit of the drive device 20 and controls the operation of each section as explained next.

The interior of the CPU 41 contains a ROM41a to store for instance operating program and various constants, and a RAM41b as the work region.

An operating section 30, equivalent to the above mentioned operating keys 31 through 38, the CPU 41 performs the control operations specified in the operating program according to the operating input information from the operating section 30.

The CPU 41 is further installed with a flash memory 48 and the CPU 41 is capable of storing information on system settings relating to all types of operations such as music record mode, reproduction volume and display mode in the flash memory 48.

A real-time clock 48 is the so-called clock section and calculates the current date and time. The CPU 41 can verify the current date and time from the real-time clock 44.

The USB interface 43 is a communication interface with the external devices connected to the USB connector 28. The CPU 41 can perform-data communication by way of the USB interface 43 with for example an external personal computer. The USB interface 43 can implement the transmitting and receiving for instance of control data, computer data, image data, and audio data.

A regulator 47 and a DC/DC converter 47 are utilized as the power supply section. When the power is turned on, the CPU 41 issues instructions for power-on to the regulator 46. The regulator 46 starts to supply power from the battery (dry cells or charger) in response to these instructions. The power supply voltage from the battery is converted to the required voltage in the DC/DC converter 47, and this voltage is supplied to each block as the operating voltage Vcc.

A terminal such as an AC adapter terminal may be formed to permit the supply of power from an external commercial power supply.

The CPU 41 can access the stick memory 1 by way of the memory interface 42, when the stick memory is inserted into the loader 22, and the recording/reproduction/editing of all types of data can be implemented.

The CPU 41 can display the required image on the display section 21 by controlling the display driver 45. The guide display and the menu for user operation or for instance a display of the file contents stored in the stick memory 1 can be implemented. Also, if image data for a moving image or a still image is recorded in the stick memory 1, then the image data can be read-out and displayed on the display section 21.

In the above example, a digital input terminal 27, a microphone input terminal 25, a line input terminal 26 a headphone terminal 23 and a line output terminal 24 can be formed for input and output of music signals, voice signal and audio signals, etc.

An SAM (Security Application Module encrypting and execution processor) 50, a DSP (Digital Signal Processor), ADDA converter (analog→digital, digital→analog converter) 54, a power amplifier 56, a microphone amplifier 53, an optical input module 51 and a digital input section 52 are installed as the audio signal processing system corresponding to the above mentioned terminals.

The SAM50 performs data encryption and execution between the CPU 41 and the DSP49, and also exchanges the encryption key with the CPU 41.

The DSP49 performs audio data compression and decompression based on instructions from the CPU 41.

The digital input section 52 performs input interface processing of the digital-audio data received from the optical input module.

The ADDA converter 54 performs analog-to-digital conversion and digital-to-analog conversion of audio signals.

The input and output of the audio signals in the above blocks is performed as follows.

The signal supplied to the digital input terminal 27 as digital audio data from an external device by way of the optical cable, is photo-electrically converted by way of the optical input module 51 and input, and receive signal processing performed according to the transmission format of the digital input section 52. The digital audio data extracted from the received signal is compressed in the DSP49, encrypted in the SAM50 and supplied to the CPU 41 for instance for recording of the data onto the stick memory 1.

When a microphone is connected to the microphone input 25, after the audio signal input to the microphone input 25 is amplified in the microphone amplifier 53, A/D conversion is performed in the ADDA converter 54, and the output supplied to the DSP49 as digital audio data. After data compression in the DSP49 and encryption in the SAM50, the data is supplied to the CPU 41, for instance for recording of data onto the stick memory 1.

The input audio signal from an external device connected to the line input terminal 26 is A/D converted in the in the ADDA converter 54 and the output supplied to the DSP49 as digital audio data. After data compression in the DSP49 and encryption in the SAM50, the data is supplied to the CPU 41, for instance for recording of data onto the stick memory 1.

In cases such as the output of audio data that was read-out from the stick memory 1, the CPU 41 processes that audio data through the SAM50 and performs decompression of the data in the DSP49. The digital audio data resulting from this processing is converted into an analog signal in the ADDA converter 54, and supplied to the power amplifier 56

The power amplifier 56 performs headphone amplification and line output amplification and supplies the amplified signals to respectively the headphone terminal 23 and the line output terminal 24.

Figure 4:
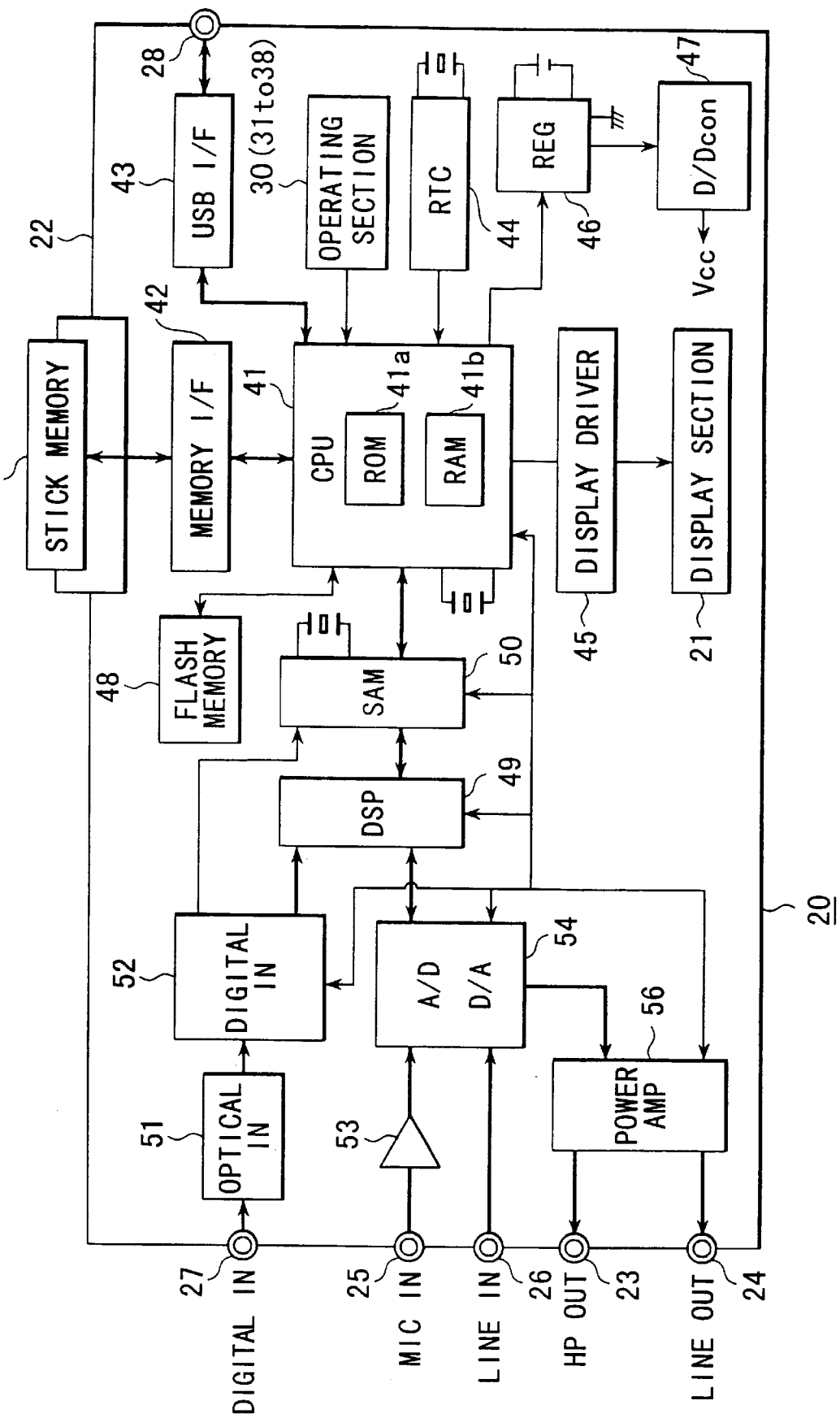
FIG. 4 is a block diagram of the drive device of the embodiment.

The structure of the drive device shown in FIG. 4 only constitutes an example and the invention is not limited by the example. In other words, any type of record/reproduction device can be utilized as long as the structure is capable of the writing and read-out of data compatible with the stick memory 1.

The present invention is also applicable to a record device comprising only a record function, and to a reproduction device comprising only a reproduction function.

4. File Configuration Inside Stick Memory

The file configuration stored in the stick memory 1 is described next.

Figure 5:
FIG. 5 is an explanatory drawing showing the directory configuration in the stick memory of the embodiment.

A typical directory configuration is shown in FIG. 5.

As previously mentioned, the main data capable of being handled by the stick memory 1 is data such as moving image data, still image data, voice data, music data and control data. The directory therefore comprises a VOICE (voice directory), DCIM (still image directory), MOxxxxnn (moving image directory), CONTROL (control directory) and HIFI (music directory) from the route directory.

The file for the music data is given in this example, so subdirectories of the HIFI (music directory) is utilized in the description of the playlist given later.

The TRKLIST track list, the A2D00001, A2D00002... audio data files, the TBPLIST playlist table, the PLIST1 PLIST2 playlist and so on are formed as subdirectories in the HIFI directory as shown in the figure.

The subdirectory names such as the folder names and file names A2D00002, PLIST1 and the file types constitute only temporary names used for providing an explanation.

The track list TRKLIST is management information such as for the audio data file, and is information equivalent to the so-called TOC in a CD or MD. Hereafter the tracklist is referred to as TOC.

In other words, the parts of the track, names and address pointer are listed as this audio data file as the track recorded on the stick memory 1. Accordingly, information such as the number and song names and access positions at reproduction recorded on the audio data file can be found by referring to the TOC in this drive device 2. Each audio data file is managed by means of a song number added as the track number in the TOC. This track number is equivalent to the song reproduction sequence during normal reproduction.

The audio data file consisting of a track holds a file for one song, and each track is managed in the track number sequence (TRK1, TRK2 . . . ) in the TOC. In the system of this example, the audio data recorded as the track is data compressed by the ATRAC2 method in DSP49.

Recording and reproduction can be performed on the tracks of this system in the directory configuration recorded with the TOC and the tracks The playlist and the playlist table recorded here allow the reproduction of many, different song sequences. The actual processing relating to the playlist table and the playlist are described later on, however the playlist table is table information for managing one or a plurality of recorded playlists. The playlist is a data file listing the song sequence of the track.

The configuration of the directory as shown in FIG. 5 constitutes only an example and the invention is not limited by the example. A file for instance, can be formed within the subdirectory, or an additional information file can be formed such as a file recorded with information appended to a track.

Figure 6:
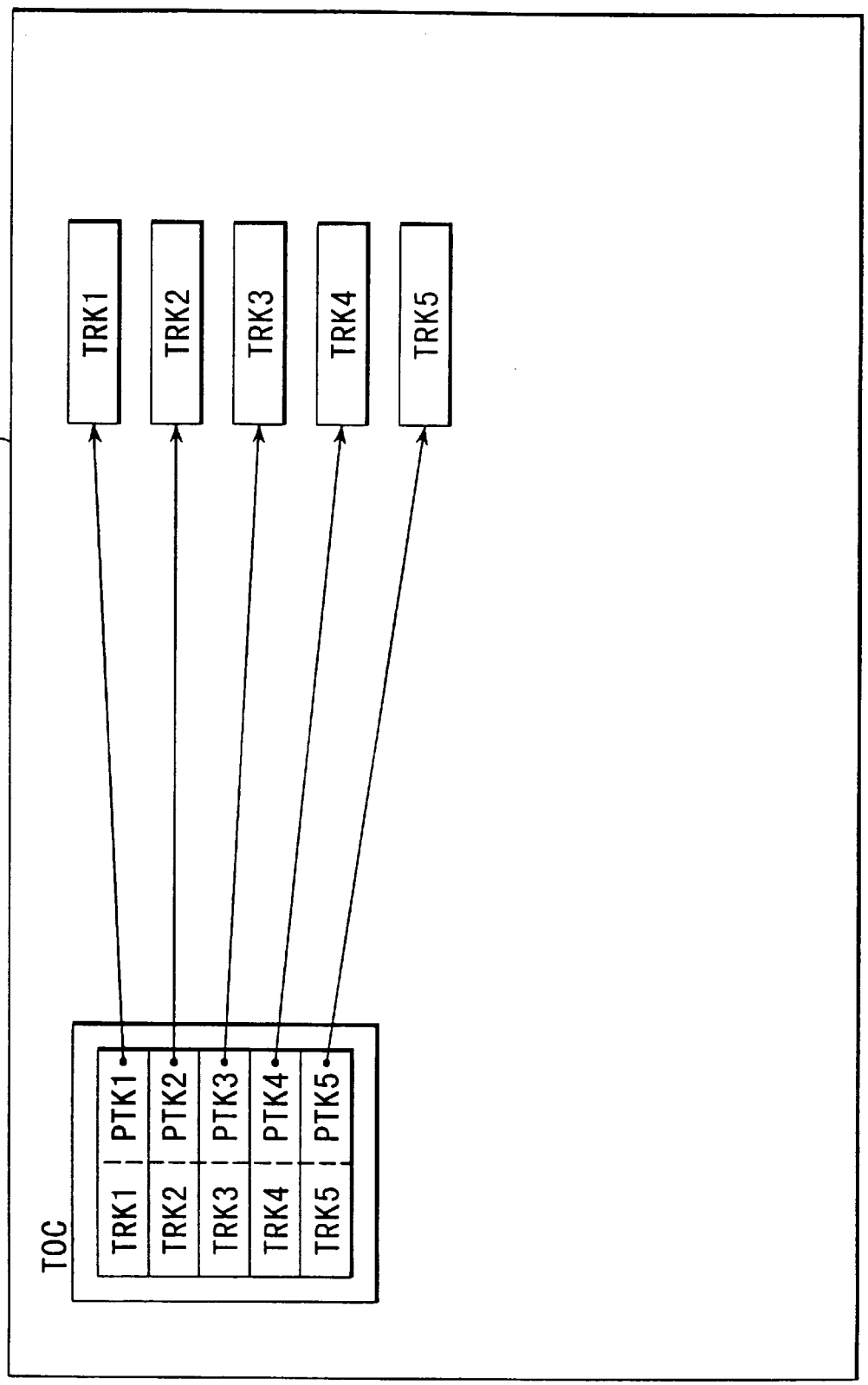
FIG. 6 is an explanatory drawing showing the file configuration in the stick memory of the embodiment.

An example of a file recorded on the stick memory 1 is shown in FIG. 6.

In this example, five tracks, or in other words five songs are respectively recorded as tracks TRK1 through TRK5 on the directory structure in the stick memory 1. These tracks TRK1 through TRK5 are in a model type format shown respectively by the TOC pointers PTK1 through PTK5.

In other words, the tracks TRK1 through TRK5 are recorded in a state managed by the TOC. The tracks can also be managed not only by the above mentioned pointer in the TOC but also by the song title and other information.

In the recorded state shown in FIG. 6 for example, during reproduction in the drive device 20, each track is reproduced in the song sequence managed by the TOC or in other words by the track number sequence. Therefore, during reproduction without any particular instructions from the user, the track TRK1 is first reproduced, and when track TRK1 is finished, the track TRK2 is next reproduced. Reproduction is thus performed in this sequence and this series of reproduction operations is ended at the point when the reproduction of track TRK5 ends.

Figure 7:
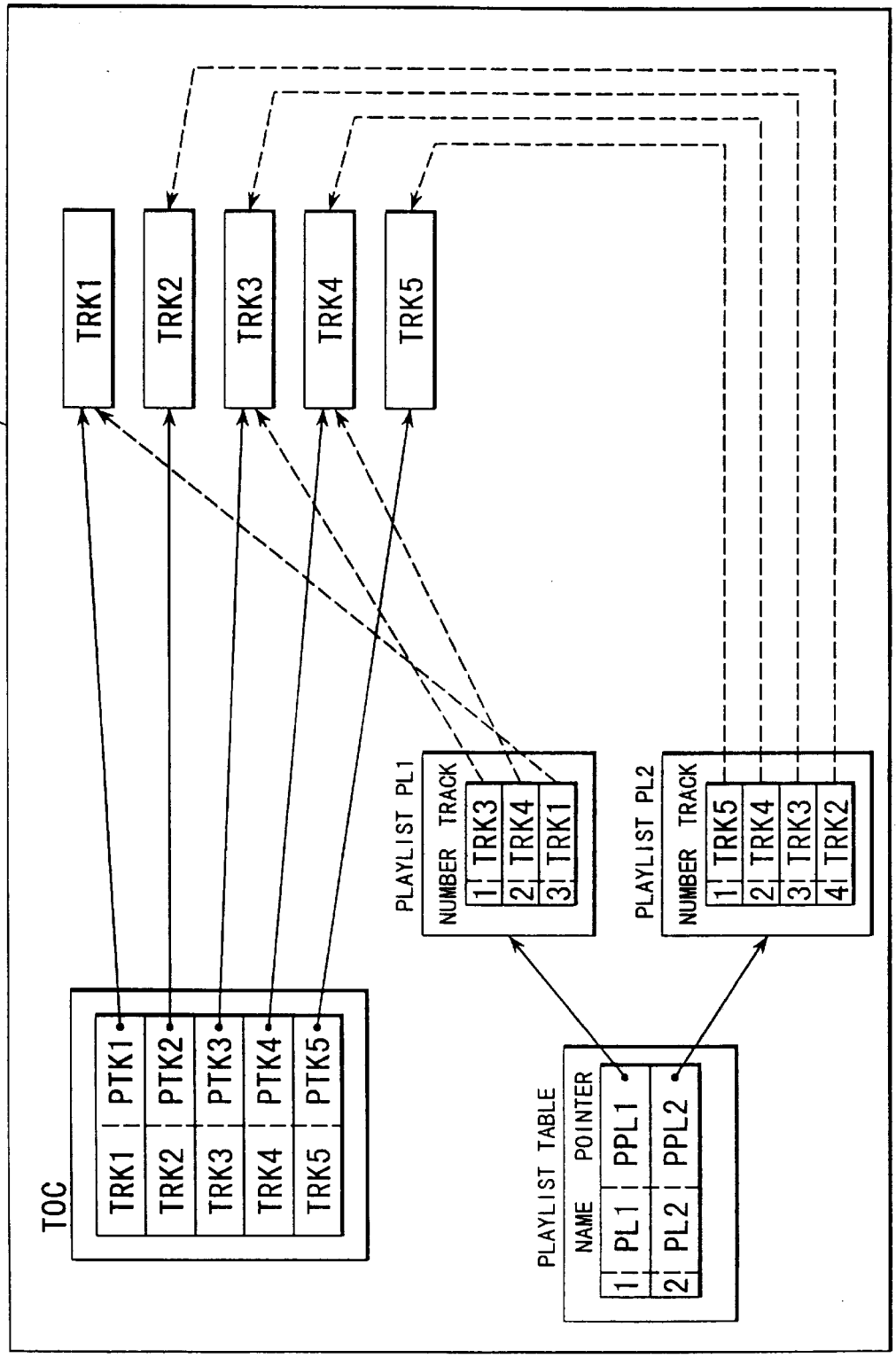
FIG. 7 is an explanatory drawing showing the file configuration in the stick memory of the embodiment.

FIG. 7 is a drawing showing the status when a playlist table and two playlists PL1 and PL2 are added to the status shown in FIG. 6.

In the playlist table, the playlists PL1 and PL2 are respectively shown by the pointers PPL1, PPL2 along with the playlist names PL1 and PL2 registered for instance by the user. The position where the playlist names PL1 and PL2 are recorded in the stick memory 1 is for instance recorded in the pointers PPL1, PPL1. In other words, the playlists PL1 and PL2 are recorded in a state managed by the playlist table.

In the PL1 and PL2, the entry number sequence of the tracks is specified, so for instance, a song sequence of tracks TRK3, TRK4 and TRK1 is registered on the playlist PL1.

When performing reproduction in the drive device 20 with the playlist selected by the user, after the position of the selected playlist recorded in the stick memory 1 is obtained as a pointer from the playlist, the reproduction operation is implemented in the song sequence registered in the playlist obtained based on the pointer. When for instance, the playlist PL1 is selected, the CPU 41 of the drive device 20 controls reproduction operation in the track TRK3, TRK4 song sequence.

In other words, in this case, after first verifying that the entry number of the playlist PL1 is track TRK3, the CPU 41 checks the pointer PTK3 of track TRK3 from the TOC, accesses the track TRK3 and performs reproduction. Next, reproduction of entry number 2 of track TRK4 is performed in the same way, and then reproduction of entry number 3 of the track TRK1 also performed.

The TOC is referred to and access performed for the track registered on the entry number when performing reproduction in the song sequence according to the playlist however, by registering the track pointer inside the playlist for instance, reproduction can be performed without having to refer to the TOC. The playlist can therefore be considered as having a TOC function.

5. Playlist Creation Process

In order to perform reproduction in the song sequence based on the playlist in this way, the recording of the playlist must first be performed.

The user therefore implements a playlist creation operation so that recording of the specified playlist with the desired song sequence is implemented in the drive device 20.

Figure 8:
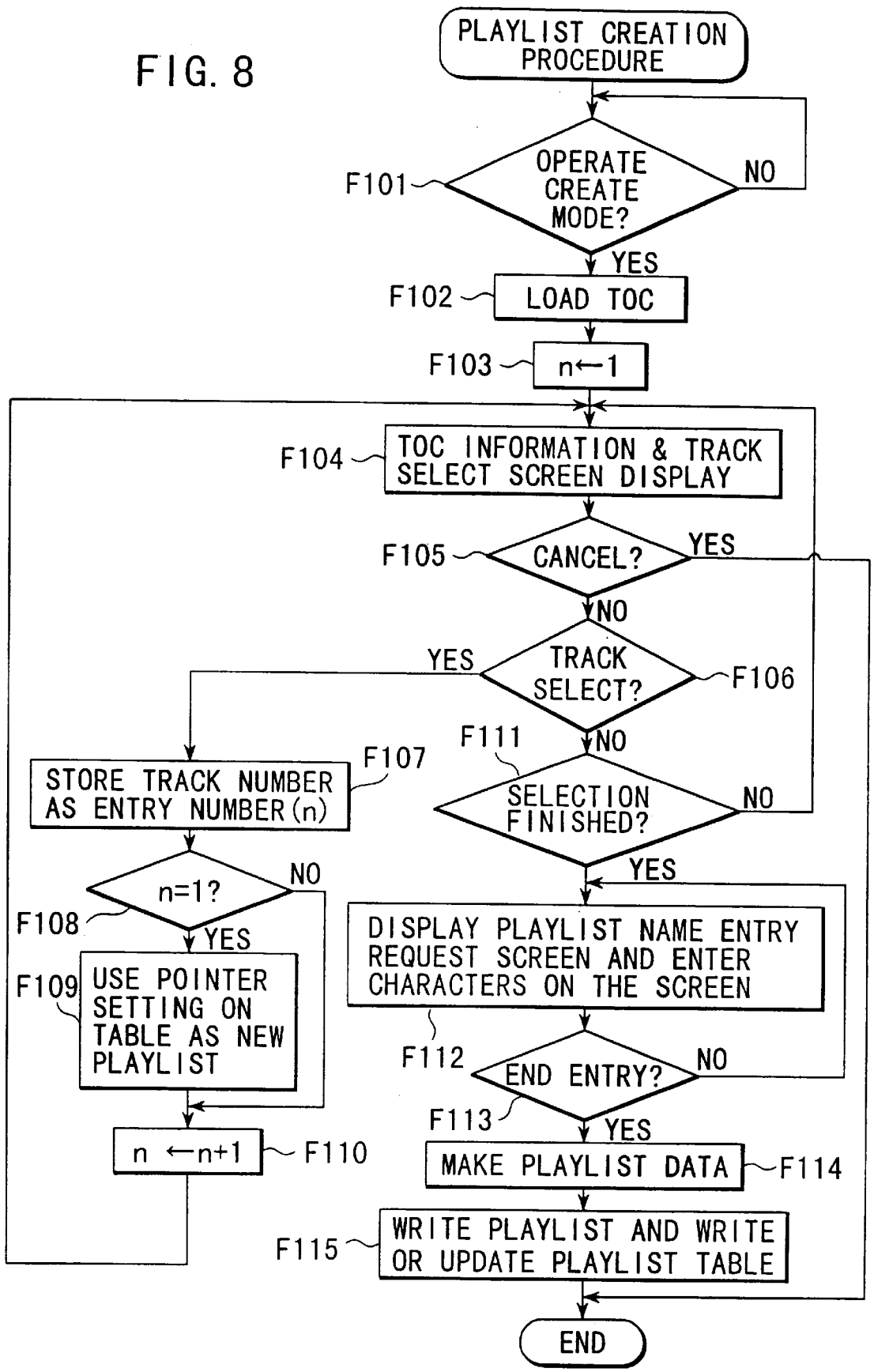
FIG. 8 is a flowchart of the prelist creation process of the embodiment.

The processing in the CPU 41 for creating the playlist is shown in FIG. 8.

The user presses the playlist edit key 38 for making the playlist.

After the CPU 41 detects the operating of the edit key 38, the process shifts to the playlist creation mode, and the process proceeds from steps F101 to F102 in FIG. 8.

In step F102, the CPU 41 access the stick memory 1 by way of the memory interface 42, reads (loads) the TOC and deploys that TOC information in a RAM41b.

In step F103, the variable n is set in 1.

Next, in step F104, the screen display is shown in the display section 21 to request track selection by the user and TOC information.

Along with for instance, displaying the track number and song titles recorded on the track, on a list in the display section 21, as TOC information, a screen display of track numbers in the sequence selected by the user is also performed.

In steps F105, F106, F107, the process is in standby status for user operation.

The user can select the desired track number by operating for instance, FF key 34 and the REW key 33, and can also make selections with the play key 31. The user can also for instance, utilize the playlist edit key 38 for specifying the end of entries for all tracks where attempting registration. The stop key 32 for instance may also have the functions of a cancel-operation key.

Needless to say, other operating keys may be utilized, or dedicated operating keys installed for use as user operating keys for track selection/cancel, or ending entry. Hereafter, an example is described utilizing the user operating keys shown in FIG. 3 for the processing from FIG. 8 through FIG. 12 however, whatever kind of key is utilized for the respective operation or whatever key is provided may be set according to the design circumstances of the drive device actually used.

The process is discontinued from step F105 when the user performs the cancel operation.

After the user has made a selection with the FF key 34 or the REW key 33 or selected the track number and set the selection with the play key 31, the CPU 41 makes the process proceed from step F106 to F107 and an entry number (n) is stored as the selected track number.

Next, in step F108, when determined that variable n=1, in other words, at the point after confirming that the entry of the first song is ended, along with making a new playlist, a pointer is set on the playlist table. In other words, management information is set for registration in the playlist table for the playlist that is to be generated.

If no playlist table is found to be present in the stick memory 1 at that point, or in other words, if not even one playlist existed at this point, then data is also generated for writing as a new playlist.

In step F110, the variable n is returned to step F104 as increments, and a display screen again appears, asking the user for entry of the next track number.

The user sequentially enters one or more track numbers and these track numbers are stored as entry numbers by means of the processing in steps F104 through F110.

At the point where one or more track numbers have been entered and the user is finished making selections, or in other words when operation to end the track number entry was performed, the processing proceeds from step F111 to F112, and the CPU 41 next, along with displaying a screen requesting entry of the name of the playlist currently being generated, also inputs the characters entered by the user.

The user can for instance, confirm entry of the characters entered by operating the play key 31 after selecting the characters or using the FF key 34 or the REW key 33. For instance, the CPU 41 can effect changes the character above the cursor on the display, according to user operation of the FF key 34 or the REW key 33, and can then verify and input those characters into the RAM41b at the point when the play key 31 is operated.

Characters can be selected one at a time according to this operation and processing, and the user can end the entry process at the point when entry of the string of characters constituting the name is finished.

When entry of the characters is finished, the process proceeds from step F113 to F114 and data is created as the playlist on the RAM41b. In other words, the playlist is created as file data, based on the track number stored in the entry number sequence.

Then, in step 115, the updating of the prelist table is performed along with writing a file as the playlist on the stick memory 1 by way of the memory interface 42. If a prelist table does not exist in the stick memory 1 at that point, a data file itself is created as the playlist table, and writing is performed on that data file. The updating of the playlist table is a process to write name data entered by the user and pointer set in step F109 as management information for the new playlist.

A playlist can therefore be recorded in the stick memory 1 as shown for instance in FIG. 7, by the above described processing.

The playlists PL1 and PL2 can be recorded by performing this playlist creation processing twice.

6. Reproduction Process

Figure 9:
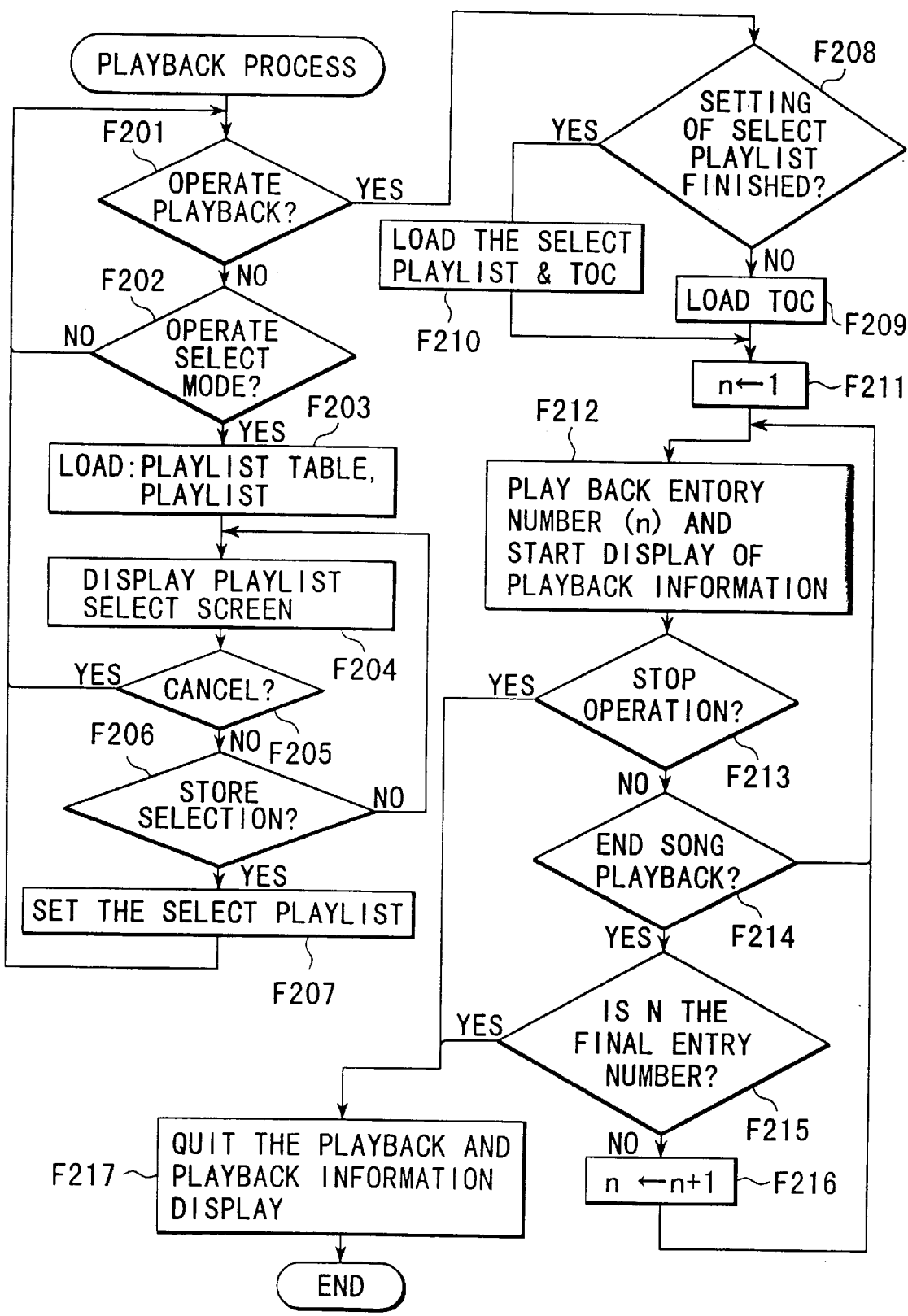
FIG. 9 is a flowchart of the reproduction process of the embodiment.

The processing in the CPU 41 shown in FIG. 9, is next described when music recorded in the stick memory 1 is reproduced as a track in the drive device 20.

The CPU 41 starts the play process when the user presses the play key 31, however the CPU 41 usually starts play of each track in the track number sequence managed in the TOC.

However, when the user performs the play process after selecting the playlist beforehand, the CPU 41 plays each track in the song sequence registered in that selected playlist.

During stopping of operation, the CPU 41 monitors the play key 31, and playlist select key 37 as operations relating to reproduction, in steps F201 and F202.

The user presses the playlist select key 33 when selection of a playlist is desired. When the playlist select key 33 is pressed, the CPU 41 processing proceeds from step F202 to F203, shifting to playlist selection mode.

Though not shown in FIG. 9, when a playlist as shown in FIG. 6, is not present in the stick memory 1 that was loaded, the playlist select key 37 is inoperable.

In step F203, the stick memory 1 is accessed by way of the interface 42, the playlist table and playlist are read-out (loaded) and this information deployed in the RAM41b.

Next, in step F204, a screen display requesting playlist information and selection of the playlist by the user is made to appear on the display section 21.

As playlist information for instance, the display section 21, displays a list of names of recorded playlists along with a screen display requesting the user to select a playlist.

The process then stands by in steps F205, F206 for user operation.

The user for instance, operates the FF key 34 and REW key 33 to select the desired playlist and enters the selection with the play key 31. The user may also use the stop key 31 as a cancel key.

When the user has performed the cancel operation, the playlist selection processing is stopped from F205, and the process returns to the monitor processing of steps F201, F202.

When the user has entered his selection or in other words, used the play key 31 after selecting from the playlist or using the FF key 34 or REW key 33, the CPU 41 processing proceeds from step F206 to F207, and the selected/entered playlist is set as the playlist to use during reproduction. The name (file name) of the selected playlist is for instance stored in the RAM41b or the flash memory. The processing then returns to the monitor processing of steps F201, F202.

One playlist is thus selected from among the recorded playlists, by means of the above processing.

In the monitor processing of steps F201, F202, when the operation by the user of the play key 31 has been detected, the processing proceeds to step F208. Here however, whether or not the playlist selection was already performed or the playlist selected is determined, in other words, whether or not the processing of step F207 is finished is determined.

If not selected or if the playlist has not been recorded, the processing returns to step F209, the TOC is read-out (loaded), and the song sequence set as the track number sequence in the TOC. In other words, the track numbers are used unchanged, as entry numbers for the song sequence.

However, when the playlist has been selected by the processing of step F207, the process proceeds to step F210, the playlist table is referred to, the playlist read-out (loaded), and the sequence of track numbers entered on that playlist is set as the song sequence. The TOC required for play(back) operation is also loaded.

When the processing of step F209 or F210 is finished, the variable n is set to 1 in step F211, the actual reproduction of the track starts from step F212.

The entry number (n) of the track is read-out here and that reproduction audio data is then output. The output undergoes the block processing as related above, implemented via the headphone terminal 23, line out terminal 24, and the USB terminal 28, etc.

During reproduction of the track, the CPU 41 displays the track number, song title, time information such as the song play progress and incidental information on the display section 21.

During reproduction of the track, the user stop operation and the end of track reproduction is monitored in steps F213, F214.

Then, at the end of reproduction of the currently played track, the process proceeds from step F214 to step F215, and a determination is made whether the current entry number (n) is the final number or not, or in other words, if reproduction has finished or not on all necessary tracks. If not finished, then the variable n is incremented in step F216 and the process returns to step F212. In other words, the track with the next entry number is played.

When the stop key 32 is operated by the user during this reproduction, or at the point where reproduction of all necessary tracks has ended, the process proceeds from step F213 or F215 to step F217, and along with ending of a series of operations constituted by the read-out (loading) from the stick memory 1 as the reproduction processing of the audio data, the deployment in the SAM50, decompression in the DSP49 and the D/A conversion processing in the ADDA converter; the display performed on the display section 21 that accompanies the reproduction is also ended.

In other words, in this kind of processing or when the playlist was selected, the reproduction proceeds in the song sequence registered in that playlist. For instance, when the playlist PL1 was selected as shown in FIG. 7, the entry number 1 becomes track TRK3, the entry number 2 becomes track TRK4 and the entry number 3 becomes track TRK1 so that the tracks TRK3, TRK4 and TRK1 are respectively reproduced in sequence. Then, at the point where the reproduction of track TRK1 has ended, the entry number 3 is the final entry number so that the process proceeds from step F215 to F217 and the reproduction ends.

When on the other hand, the playlist was not selected or there is no playlist, the entry number matches the track number so that when the tracks TRK1 through TRK5 are recorded as shown in FIG. 6 and FIG. 7, the tracks TRK1, TRK2, TRK3, TRK4, TRK5 are respectively reproduced in sequence, and the end of the track reproduction ends the reproduction operation.

The user can therefore specify a desired reproduction sequence for all or a portion of the tracks recorded on the stick memory 1 that was loaded, and record the playlist that was generated onto the recording medium, by utilizing the above playlist creation processing and reproduction processing. During reproduction, the user can also specify one desired playlist from among one or a plurality of playlists recorded on the stick memory 1 that was loaded, so that one or a plurality of tracks can be sequentially reproduced based on the specified playlist.

If the user therefore records the desired reproduction sequence or song sequence as the playlist on the stick memory 1, then, besides the normal reproduction sequence based on the TOC in that stick memory, the song sequence recorded in the selected playlist can be reproduced just by selecting that playlist. In other words, beside being able to set many song sequences as de-sired in each stick memory 1, during reproduction many different reproduction sequences on tracks can easily be enjoyed just by selecting the playlist.

Also, since the just the desired song can be selected and the song sequence registered, the user can easily reproduce many kinds of songs from among the recorded tracks, to match personal moods and preferences.

The recording of the playlist in this way and the reproduction based on the playlist, allow management that makes handling of the numerous tracks recorded on the stick memory 1 extremely easy for the user.

In cases for instance, where the number of tracks is extremely large, searching for the desired song just with the track number by using the TOC can be a bothersome task, however finding the desired song can become simple, by grouping and registering the tracks in a plurality of playlists beforehand. As one example, when many different music genres are recorded on one stick memory 1, a desired song sequence of for instance only classical music can be registered on the playlist PL1, a desired song sequence of for instance only jazz music can be registered on the playlist PL2, and further, a desired song sequence of for instance only rock music can be registered on the playlist PL3.

When the above pre-registration has been performed and the user wants to hear a song grouped into the jazz genre, the playlist PL2 is first selected and reproduction implemented with the reproduction operation of FIG. 9. Then, only jazz songs are reproduced in sequence. Also, when the user wants to hear only a particular song from among that jazz music, then the user proceeds through the song such as by using the FF key during reproduction, based on that playlist PL2 and can therefore easily and speedily implement reproduction of the target song.

This method can be used not only for grouping of genres but also by music album such as CDs, or by artist as preferred by the user. When for instance, many tracks dubbed for instance, from a plurality of music albums are recorded onto one stick memory 1, if registered in playlists according to album, then by selecting a playlist and starting reproduction, the user can then enjoy listening to reproduction of just the target album.

In this way, the playlist can be set not just for a song sequence, but can also function to establish an order among the tracks registered on the stick memory 1.

7. Copy Process

The system of this example is also capable of copying the playlist recorded on the stick memory 1, onto another stick memory 1. This copy process is explained next.

Figure 10:
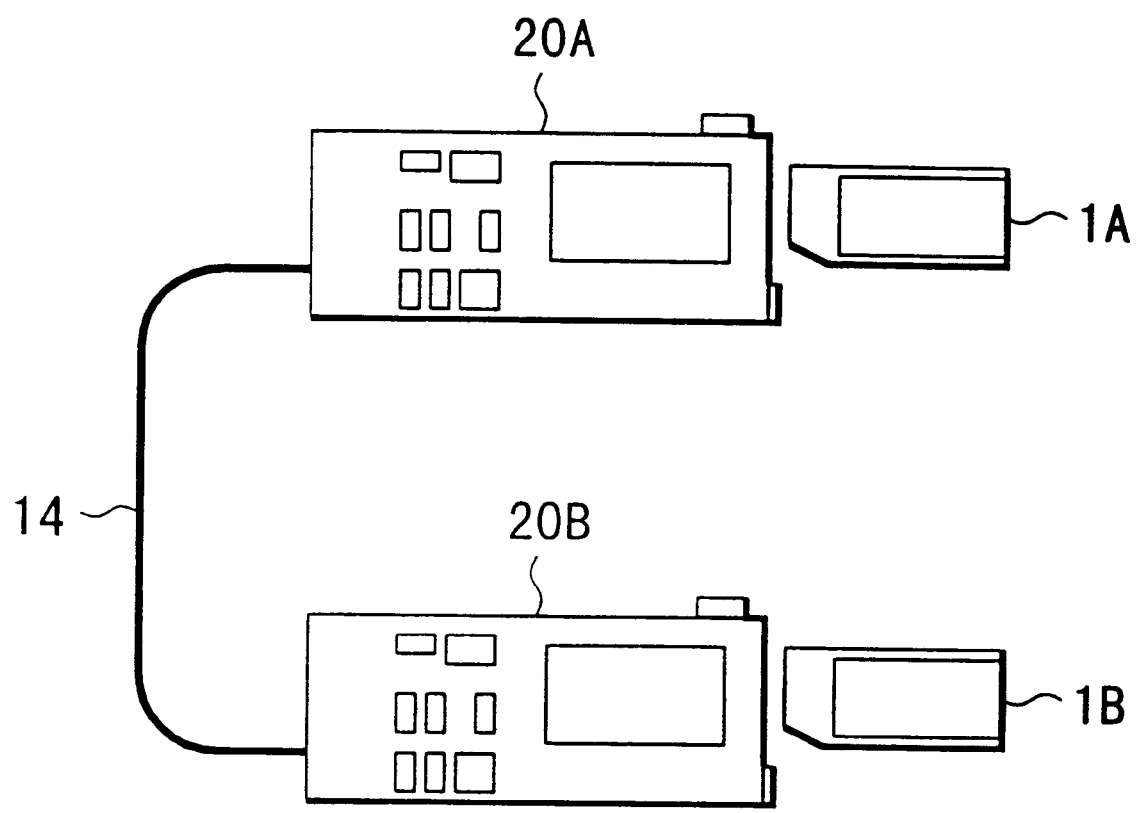
FIG. 10 is a concept view of a typical connection for the reproduction process of the embodiment.

FIG. 10 shows two drive devices 20A and 20B respectively loaded with two stick memories 1A, 1B and connected by a USB connector 14. In this connection, the stick memory 1A loaded in the drive device 20A is the copy source, and the stick memory 1B loaded in the drive device 20B is the copy destination in a connection arrangement allowing copying of the playlist as well as the track data.

When one or a plurality of tracks and one or a plurality of playlists are recorded in the stick memory 1A, a playlist and the track entered in that playlist are copied onto the stick memory 1B so that when the stick memory 1B is used for reproduction, a reproduction operation identical to the reproduction by means of the playlist registered in the stick memory 1A is obtained.

Figure 11:
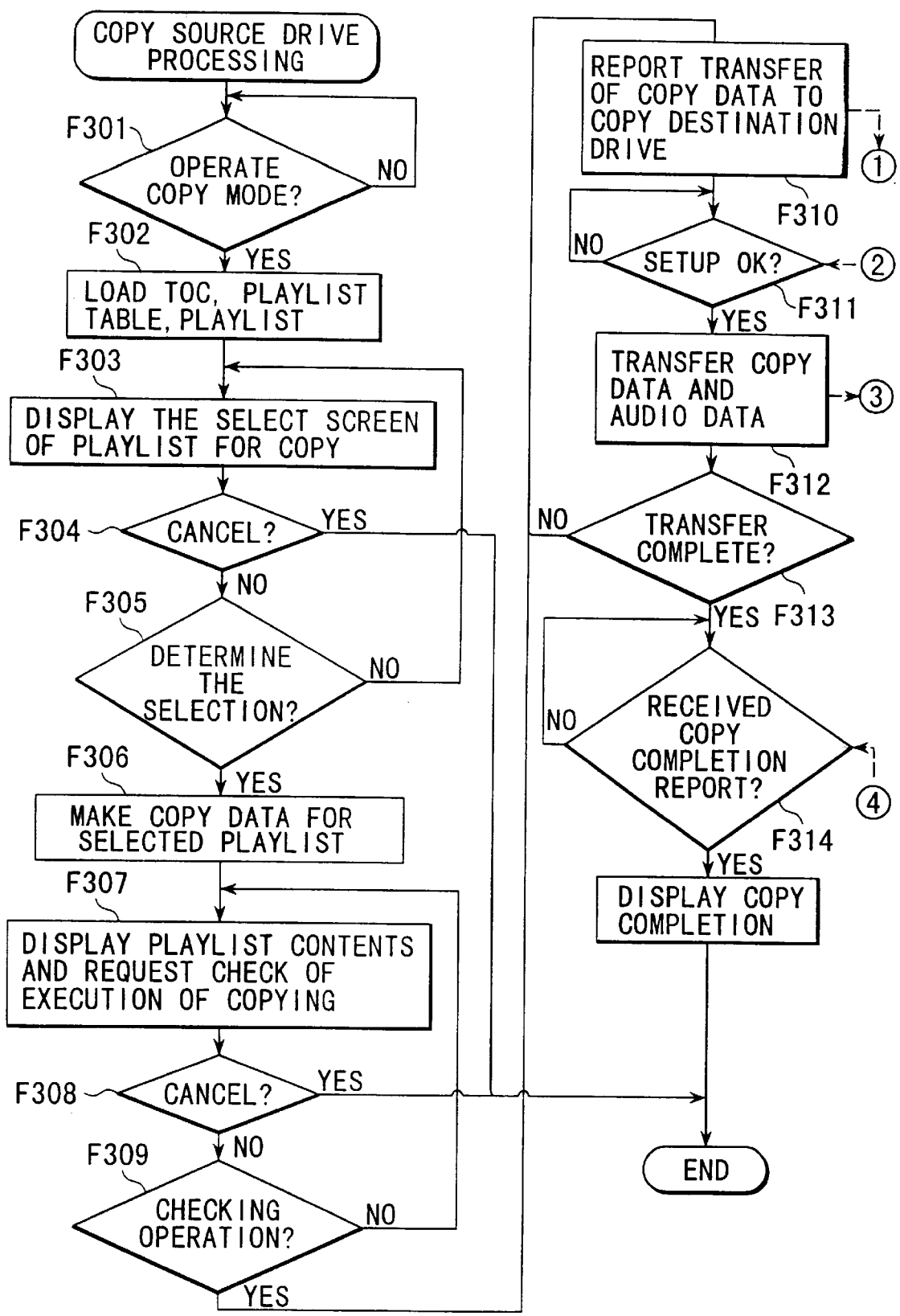
FIG. 11 is a flowchart showing the processing in the copy source drive device during copy in the embodiment.
Figure 12:
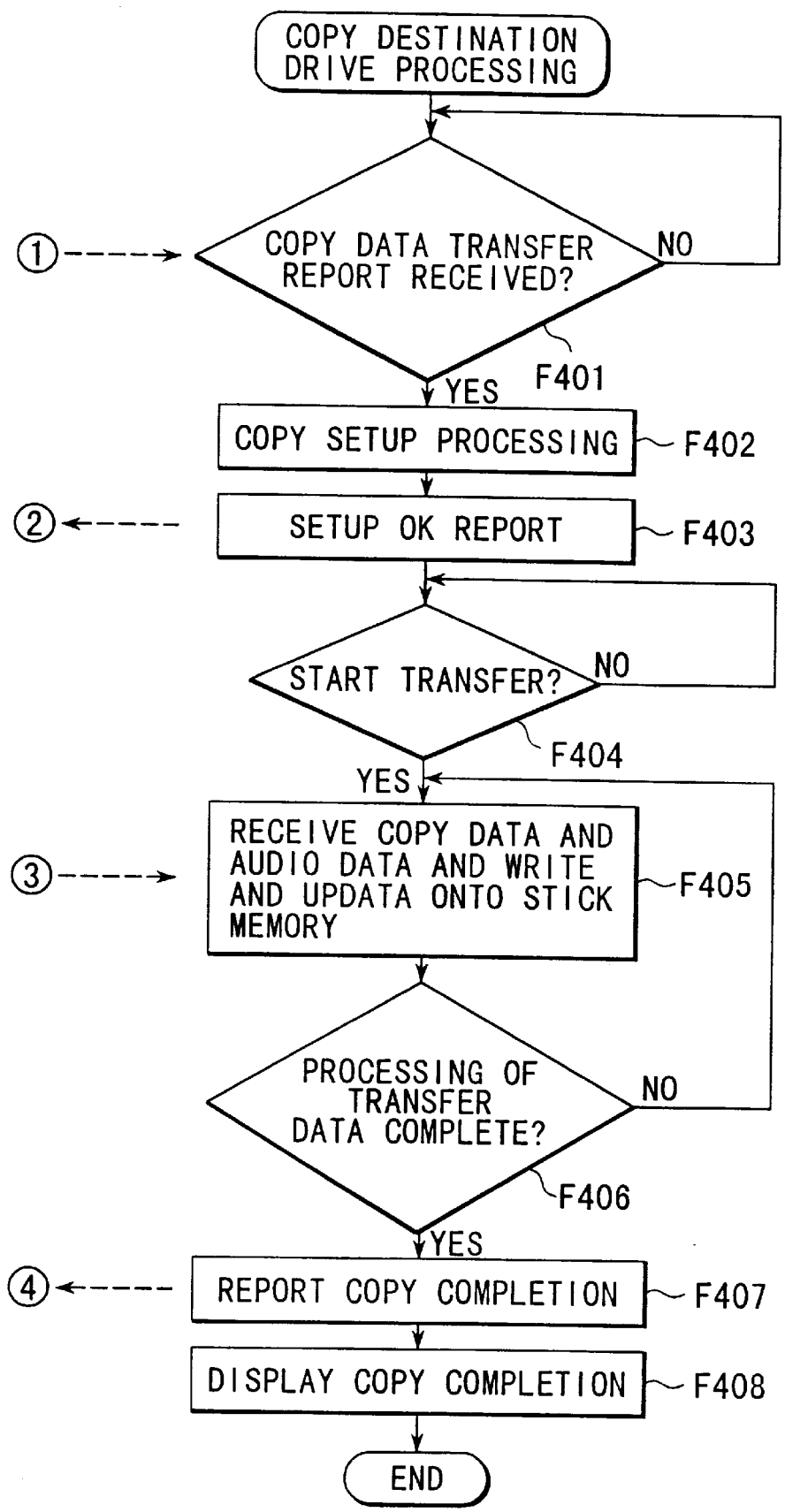
FIG. 12 is a flowchart showing the processing in the copy destination drive device during copy in the embodiment.

The copy operation processing flow by the CPU 41 for the drive device 20A as the copy source is shown in FIG. 11, and the copy operation processing flow by the CPU 41 for the drive device 20B as the copy destination is shown in FIG. 12.

After the user has connected the drive devices 20A, 20B loaded with the respective stick memories 1A and 1B as shown in FIG. 10, to perform copying, the copy mode operation is performed on the drive device 20A side. Copy can be performed for instance, by holding down the playlist edit key 38 for two seconds or more.

The CPU 41 of drive device 20A, shifts to copy mode after detecting the copy mode operation and the processing proceeds from step F301 to F302.

In step F302, the CPU 41 accesses the stick memory 1A by way of the memory interface 42, loads (reads out) the TOC, playlist, and playlist table and deploys this various information in the RAM41b.

Next, in step F303, a screen is displayed on the display section 21 requesting selection by the user of the playlist for copying.

Along with for instance displaying a list of recorded playlist names, a screen appears on the display section 21 for the user to enter one playlist. The process then stands by in steps F304 and F305 for operation by the user.

The user selects the desired playlist by operating for example the FF key 34 or the REW key 33 and then enters the selection with the play key 31. The user may also cancel a copy operation that should be stopped When the user has performed the cancel operation, the processing is discontinued from step F304.

After the user has selected the track number with the FF key 34 or REW key 33 and entered the selection with the play key 31, the CPU 41 processing proceeds from step F305 to F306, and the copy data for the selected playlist that was entered, in other words, the data for sending to the drive device 20B side is generated.

Next, in step F307, the copy data, in other words, the contents of the selected playlist is presented to the user on the display section 21 and a check message for implementing copying displayed. The track number entered in the selected playlist and the song name are for instance displayed and a check message queries the user about whether or not to implement copying for those contents.

If the user has made a mistake in selecting the playlist, then the processing can be ended at that point by performing cancel operation. In that case, the processing of FIG. 11 may be re-performed.

If the user on the other hand, verifies the copy contents, then the processing proceeds from step F309 to F310 after a copy OK check, and the actual copying starts.

The following communication operations are performed by means of the USB interface 43.

In step F309, first of all, a report (or notice) of the start of copy data transfer to the copy destination of drive device 20B is performed. When a report of the start of such a data transfer in the copy destination of the drive device 20B is detected in step F401, the processing proceeds to step F402, and the copy operation or in other words, the setup processing for the receive and the write process is performed.

Though not shown in the procedure in the flowchart, when write is impossible in the stick memory 1B or when some kind of problem occurs with receive operation or write operation, then an error report is issued to drive device 20A, and the copy operation is error-terminated.

When the copy setup procedure is complete in the drive device 20B, the CPU 41 of drive device 20B issues a setup-OK report to the drive device 20A in step F403.

In the copy source of the drive device 20A, after the report of step F310 in FIG. 11, the process stands by for a setup-OK report in step F311, and when the setup-OK report is received, the processing proceeds to step F312 and the transfer of copy data and audio data commences. The copy data as used here, refers to playlist data that is subject to copying. Also, the audio data as used here, refers to data for one or a plurality of tracks entered in that playlist.

When transfer starts in step F312, the processing on the drive device 20B side proceeds from step F404 to F405 in FIG. 12, and the receive processing of the transferred copy data and audio data as well as the data writing onto the stick memory 1B is implemented.

The processing of step F312 in the drive device 20A is implemented until the exchange of copy data and audio data is complete. When transfer (exchange) is complete, the processing stands by in step F314 for a copy completion report.

The processing of step F405 in the drive device 20B is implemented until the reception of the required audio data and copy data that was sent, as well as the writing onto the stick memory 1B is complete.

The updating (rewriting) of the TOC, and the updating (rewriting) or creation of the playlist table is also implemented along with the writing of the in-coming transferred audio data and playlist.

When the reception and writing is complete, the process proceeds from step F406 to F407, and along with transmitting a report that copy recording per the drive device 20A has ended normally, a copy end message is displayed on the display section 21 in step F408, and the copy process ends.

In the drive device 20A on the other hand, when a report of normal copy completion is received, the process proceeds from step F314 to F315, and here also, a copy end message is displayed on the display section 21 and the copy process ends.

Performing the copy processing as described above, allows the user to copy a playlist recorded on the stick memory 1A, onto the stick memory 1B and enjoy reproduction of the music in the same desired song sequence on the stick memory 1B. In other words, a playlist registered on one stick memory 1, can be effectively utilized even on another stick memory 1.

Also, if a playlist is created and organized on the stick memory 1A such as by genre or by album, then the music of just a particular album of that particular genre can also be copied, and for instance, the bothersome task of selecting and copying a song of a particular genre becomes unnecessary. In other words, not only can the playlist itself be effectively utilized but the operation of copying a track can also be greatly simplified.

In the above description, the target track was also copied along with the playlist however, when the target track is already recorded in the copy destination of the stick memory 1B, then copying of just the playlist is sufficient.

The present invention is not limited to only the structure and operation of the above related embodiments, and all types of variations and adaptations in particular to the detailed procedures described previously for the playlist creation processing, reproduction processing and copy processing are within the scope of the present invention.

When the data recorded on the recording medium for instance was music data, reproduction can be made to start after an optional amount of time has elapsed within the track, by specifying a reproduction start position on the playlist of the track. By further for example, specifying a record address on the recording medium and the relative elapsed time from the beginning of the track specified on the playlist, reproduction can be made to start not only from the beginning of the track but from within the song. Thus, reproduction can also be performed by linking together only a particular phrase spanning and linking a plurality of tracks in music recorded in a track type configuration.

The system of the present invention further is not limited to the stick memory as shown in FIG. 1, and fixed memory mediums of other external shapes such as memory chips, memory cards and memory modules may also be utilized. The memory device of course, is not limited to flash memories and other types of memory devices may also be utilized.

Also, the present invention is applicable not only to fixed memories but also to other disk recording mediums such as minidisks, DVD (Digital Versatile Discs), hard disks and CD-R.

The music tracks utilized as one recording medium were exclusively for reproduction here, however a medium having a writable area such as a hybrid MD may also be implemented. The same is true of course for media having a RAM area or a ROM area as a semiconductor media.

In other words, if the media has as least a playlist and playlist table capable of being written on, then the system utilizing that media is applicable to the present invention.

The above examples further described a playlist as a means to specify a song sequence for a music data file constituting a track, however this method is nothing more than an example. The present invention is not limited to a file with music data as the track, and for instance moving image files, still image files and audio data files are all applicable to the present invention.

As can be understood in the above description of the present invention, a recording device loaded with a recording medium is recorded with play list information generated specifying a desired reproduction sequence on all or a portion of data files so that recording can be performed on a recording medium; further by specifying one desired reproduction information from among one or a plurality of reproduction list information recorded on a recording medium loaded in a reproduction device, one or a plurality of data files can be sequentially reproduced in a sequence based on the specified reproduction list information.

Therefore, if the user records the reproduction list information of a desired reproduction sequence on the recording medium, then during reproduction, besides the normal reproduction sequence based on the TOC constituting the management information of the record medium, reproduction can be achieved in the song sequence set in the selected reproduction list information, just by selecting that reproduction list information. In other words, the user can enjoy flexible and easy reproduction of a data file in many different reproduction sequences on each recording medium.

Also, the fact that reproduction is possible based on this reproduction list information and recording of this kind of reproduction list information, means that the user can quite easily handle a large number of data files recorded on a recording medium.

In the present invention, the recording device comprises a communication means capable of performing communication with external reproduction devices, the recording means is capable of recording onto the loaded recording medium, the reproduction list information sent from the reproduction device and received by way of the communication means; the reproduction device on the other hand, besides being capable of performing communications between external recording devices, comprises a communication means capable of transmitting reproduction list information contents specified by a specifying operation means, to an external recording device. The reproduction list information recorded on the recording medium loaded in the reproduction device can therefore be copied onto a recording medium loaded in the recording device. The user can therefore make effective use of the recorded reproduction list information of a recording medium even on another recording medium.

What is claimed is:

1. An editing method to edit a playlist for reproducing main data in a desired reproduction sequence from a recording medium having a record region recorded with a plurality of the main data, a first management region having information to manage a recording position of the main data, and a second management region having information for managing the desired reproduction sequence of the main data, comprising:

a displaying step for displaying the information relating to the main data recorded on the record region based on the information in the first management region;

a selecting step for sequentially selecting the main data in order to register on the playlist using the displayed information according to a user operation; and a registering step for registering the information related to the first management region related to the selected main data and the reproduction sequence of the selected main data on a related playlist, and for writing the related playlist on the second management region.

2. The editing method as claimed in claim 1 wherein said editing method comprises the further step of creating a plurality of playlists in said second management region.

3. The editing method as claimed in claim 2 wherein said editing method comprises the further steps of generating a playlist table for managing said plurality of playlists and recording said playlist table in said second management region.

4. The editing method as claimed in claim 3 wherein said playlist table is generated when said playlist table is not found in said second management region of said recording medium.

5. An editing device for editing a playlist for reproduction of data in a desired reproduction sequence from a recording medium having a record region recorded with a plurality of main data, a first management region having information to manage a recording position of the main data, and a second management region having at least a playlist for managing the reproduction sequence of the main data, comprising:

display means for displaying information related to the main data recorded in the record region based on information in the first management region;

operating means operated by a user for sequentially selecting the main data in order to register the playlist from among the displayed information;

write means for writing an edited playlist onto the second management area of the recording medium; and control means for displaying with the display means the information related to the main data recorded on the record region based on the information in the first management region, for obtaining by the operating means the instructions for the main data selected by the user from the information displayed with the display means, for registering on a related playlist the data selected by the user with the information relating to the first management region and the reproduction sequence of the selected main data, and for recording the related playlist in the second management region of the recording medium by use of the write means.

6. The editing device as claimed in claim 5 wherein said editing device produces a plurality of playlists recorded in said second management region.

7. The editing device as claimed in claim 6 wherein said editing device further further comprises means for generating a playlist table and and for recording said playlist table in said second management region for managing the plurality of playlists.

8. The editing device as claimed in claim 7 wherein said editing device further comprises means for generating a new playlist table when said playlist was not retrieved in said second management region on said recording medium.

* * * * *